United States Patent
Chu et al.

(10) Patent No.: US 6,930,819 B2
(45) Date of Patent: Aug. 16, 2005

(54) MINIATURIZED EXTERNAL CAVITY LASER (ECL) IMPLEMENTED WITH ACOUSTIC OPTICAL TUNABLE FILTER

(75) Inventors: Raymond R. Chu, Cupertino, CA (US); Wilson T. C. Wong, Cupertino, CA (US)

(73) Assignee: Acceeze, Inc., Santa Clara, CA (US)

( * ) Notice: Subject to any disclaimer, the term of this patent is extended or adjusted under 35 U.S.C. 154(b) by 7 days.

(21) Appl. No.: 10/428,899

(22) Filed: May 3, 2003

(65) Prior Publication Data

US 2004/0218250 A1 Nov. 4, 2004

(51) Int. Cl.[7] .............................. G02F 1/33; G02F 1/11; H01S 3/117; H01S 3/10
(52) U.S. Cl. ..................... 359/310; 359/285; 372/13; 372/20
(58) Field of Search .................. 359/308–314, 359/285; 372/9, 20, 23, 38.01, 92, 98, 102, 10–13, 22, 28, 32, 99

(56) References Cited

U.S. PATENT DOCUMENTS

| | | | |
|---|---|---|---|
| 5,140,599 A | 8/1992 | Trutna et al. | 372/20 |
| 6,031,852 A | 2/2000 | Thompson et al. | 372/20 |
| 6,157,660 A * | 12/2000 | Hill | 372/27 |

* cited by examiner

Primary Examiner—Georgia Epps
Assistant Examiner—William Choi
(74) Attorney, Agent, or Firm—Bo-In Lin

(57) ABSTRACT

An optical tunable laser design for the optical telecommunication industry is disclosed in this invention. This new design is economical, reliable, robust and with superior optical performances. The design offers broadband tunability, high output power, narrow laser line-width and high SMSR. And in addition, the tunable laser is distinguishable from conventional designs by the mere facts that there are no moving parts, therefore, making it very reliable, and the tuning method of this invention is non-thermal and non-mechanical making its tuning very fast in the sub-millisecond range. In the manufacturing front, it is low cost and easy to produce. It can be achieved with automation equipment like those used in the IC placement and PC assembly industry, therefore, the products as that disclosed in this invention can be provided with significantly reduced production costs and marketed with very competitive price.

14 Claims, 4 Drawing Sheets

MINIATURIZED EXTERNAL CAVITY LASER (ECL) IMPLEMENTED WITH ACOUSTIC OPTICAL TUNABLE FILTER

FIELD OF THE INVENTION

The present invention relates generally to apparatuses and method for providing tunable laser for optical fiber signal communication systems. More particularly, this invention relates to new configurations and methods for providing external cavity laser (ECL) implemented with acoustic optical tunable filter to achieve high speed and board range tuning with reduced channel hopping while providing long term reliable operations under severe operational environments.

BACKGROUND OF THE INVENTION

Conventional technologies of ECL based tunable lasers commonly implemented with mechanical actuators are still confronted with several technical challenges and difficulties due to the limitations of slower tuning speed, susceptibility to environmental vibrations and poor long-term stability/reliability. These shortcomings limit the applications of the ECL based tunable lasers to optical-fiber telecommunication systems. In the meantime, there is an ever-urgent demand to resolve these limitations and difficulties.

Specifically, in fiber telecommunications, tunable lasers are essential to provide system reconfiguration and reprogramming and the key parameters in optical networks are the speed, range, stability, and flexibility of wavelength tuning. Particularly, as digital video, audio and wide varieties of digital data and signals are transmitted via broadband networks, the lack of flexibility in network management becomes an ever-increasing headache for network managers among carriers. As optical network deployment approaches saturation and becomes ever so complicated and expensive, re-deployment and re-configuration become necessary. Therefore, flexible/tunable optical components become essential for next generation optical telecomm equipment. Different network systems implemented with tunable components are being developed currently or in the near future at major equipment makers. Furthermore, future applications may also require a laser with a higher power to compensate the components losses and a narrower linewidth to battle with chromatic dispersion. An ECL based laser can potentially meet all these requirements.

Wada et al. disclose in U.S. Pat. No. 573,466 entitled "Method for Selecting Wavelength in Wavelength-tunable Lasers and Laser Oscillators Capable of Selecting Wavelengths in Wavelength-Tunable Lasers", a laser resonator with a mirror on the input side and output side. A laser medium is placed in the resonator and can be oscillated in a predetermined range of wavelengths. A crystal to which is piezoelectric element is attached, the crystal receiving acoustic waves from the piezoelectric element in accordance with a desired wavelength; and a polarizing plate which is placed in the laser resonator and transmits only the output light beam having a prescribed plane of polarization or having a prescribed direction of light propagation among the output light beams from the laser medium. The apparatus thereby outputs only the desired wavelength. The tunable lasers disclosed by Wada et al. is limited by using a collinear configuration of the a AO crystal, in which an acoustic wave and light wave propagate along the same direction that has shown very limited usefulness in the technology fields of telecommunication. The filtering line-width produced by such laser is very wide, much wider, e.g., an order of magnitude wider, than the channel spacing of 0.2 nm of a 25 Ghz space telecom tunable laser. And the size of the crystal would likely to be an order of magnitude longer then a size that would fit into a miniaturized tunable laser suitable to implement in the modern telecommunication systems. Furthermore, Wada's tunable laser is still limited by the inherent characteristics of an Acousto-optical filter that there will be wavelength shifts introduced by the acoustic wave. If a backward path is applied, there would be double shifts and the tunable laser as disclosed by Wada et al. would not be able to sustain a viable oscillation suitable for application in modern telecommunication systems.

Gutin disclosed in a Patent Application Ser. No. 20020018496, entitled "Tunable Diode Laser System Apparatus and Method", a tunable laser system wherein the tuning of the laser is accomplished by a micro-mirror array (MMA) formed as two-dimensional linear array of micro-mirrors manufactured by applying the micro-electromechanical system (MEMS) technologies. Due to the limitation of the speed of movements of the micro-mirrors, the tuning speed of the diode laser system is limited to a microsecond range. Furthermore, potential problems associated with moving parts, such as problems of long-term reliability and stability, also hinder practical applications of the diode lasers as disclosed by Gutin in the fiber network systems that demand a high level of reliability and stability over long term operations.

Another difficulty of the ECL based tunable lasers is a critical problem with mode hopping and it often limits the manufacturability in terms of cost and yield, and in most cases, becomes its limiting factor for optical and tuning performances. It is much more difficult to make an ECL-based laser provided with an operational feature to tune continuously across the entire optical telecommunications bands. It is often discretely tunable only on the ITU grids. The mechanism of mode hoping can be understood with such: the selected laser cavity mode (longitudinal oscillation wavelength) and the narrow-band filter mode (center wavelength) do not align with each other. The mode hopping problem results in a competition of adjacent laser cavity modes, both allowable within the narrow-band filter linewidth, oscillating alternatively or in an unstable manner. Such a problem is unavoidable because both tuning mechanisms are often realized with one tuning device that can accommodate one but not the other unless a perfect optical alignment is achieved which aligns the two modes to the same wavelength and moves the modes co-linearly. That is the reason why it becomes very difficult and costly to provide an ECL-based tunable laser with continuously tunable capability over the entire optical band.

For these reasons, an ECL based laser when limited by the technical difficulties even with several performance advantages, the conventional ECL-based lasers are still of limited usefulness for application in the fiber networks. Therefore, a need still exists in the art of optical fiber system and component manufacturing and design, particularly those related to ECL-based lasers, to provide new and improved system and component configurations and designs to overcome the above-mentioned technical difficulties and limitations.

SUMMARY OF THE PRESENT INVENTION

It is therefore an object of the present invention to provide a tunable laser for the optical telecommunication industry that is economical, reliable, robust and with superior optical performances such that the above mentioned limitations and difficulties can be resolved. Specifically, it is an object of this invention to provide a tunable laser with no moving parts for the fiber networks that offers broadband tunability, high output power, narrow laser line-width and high SMSR, and highly reliable. Furthermore, the method of tuning laser as disclosed in this invention is non-thermal and non-mechanical such that the tuning speed is in the sub-microsecond range.

Furthermore, it is the object of this invention to provide high-speed tunable laser with a configuration that is convenient to manufacture and can be produced economically at a relatively low cost. Specifically, the manufacturing process can be performed with highly automated processes as that applied in the electronic industries for manufacturing the integrated circuits and electronic package and assembly processes. The tunable lasers of this invention can be produced with competitive price and can be practically implemented in wide ranges of optical fiber networks for telecommunication applications.

It is another object of this invention to provide an ECL-based tunable laser that includes a digital signal processing (DSP) based high-speed electronic controller to perform multiple high bandwidth servo loops of control. Furthermore, by reducing the size of the acousto-optical tuning device, the tunable laser of this invention can be placed onto an industrial standard 18-pin butterfly package that is seam sealed for convenient application and long-term reliable operations. The tunable laser of this invention further includes electronic interface that is compatible with OIF communications protocols for tunable devices.

Briefly, in a preferred embodiment, the present invention discloses an external cavity tunable laser. This external cavity tunable laser includes an external cavity tunable laser that includes a frequency-tuning device configured as an acousto-optical-cell including a first and a second acousto-optical diffraction means having a narrow-band optical filtering Bragg grating. In a preferred embodiment, the first acousto-optical diffraction means includes a first acousto-optical crystal and the second acousto-optical diffraction means includes a second acousto-optical crystal. The external cavity tunable laser of further includes a reflection mirror driven by a PZT assembly to reflect a beam projected from the acousto-optical cell back to transmit therethrough again. The external cavity tunable laser further includes a first electrode connected to the first acousto-optical diffraction means and a second electrode connected to the second acousto-optical diffraction means. The first and second acousto-optical diffraction means having diffraction phase gratings for intra-cavity narrow-band wavelength filtering and the first electrode is connected to an RF signal for tuning a central frequency of the narrow band Bragg grating the second electrode is connected to a second electric source to provide a second order filtering for compensating a wavelength shift.

In a preferred embodiment, this invention further discloses an external cavity tunable laser that includes a frequency-tuning device configured as an acousto-optical cell and a reflection means for forward and backward transmitting an optical beam through the acousto-optical cell for generating an optical beam with zero-wavelength shift and at least twice filtered by the acousto-optical cell. In a preferred embodiment, the acousto-optical cell further includes a first and a second Acousto-optical crystal. In another preferred embodiment, the acousto-optical cell further includes a first and a second acousto-optical diffraction means disposed in an acousto-optical crystal. In another preferred embodiment, the acousto-optical cell further includes a first and a second acousto-optical diffraction columns respectively disposed in an acousto-optical crystal.

These and other objects and advantages of the present invention will no doubt become obvious to those of ordinary skill in the art after having read the following detailed description of the preferred embodiment, which is illustrated in the various drawing figures.

DETAILED DESCRIPTION OF THE INVENTION

Figure 1:
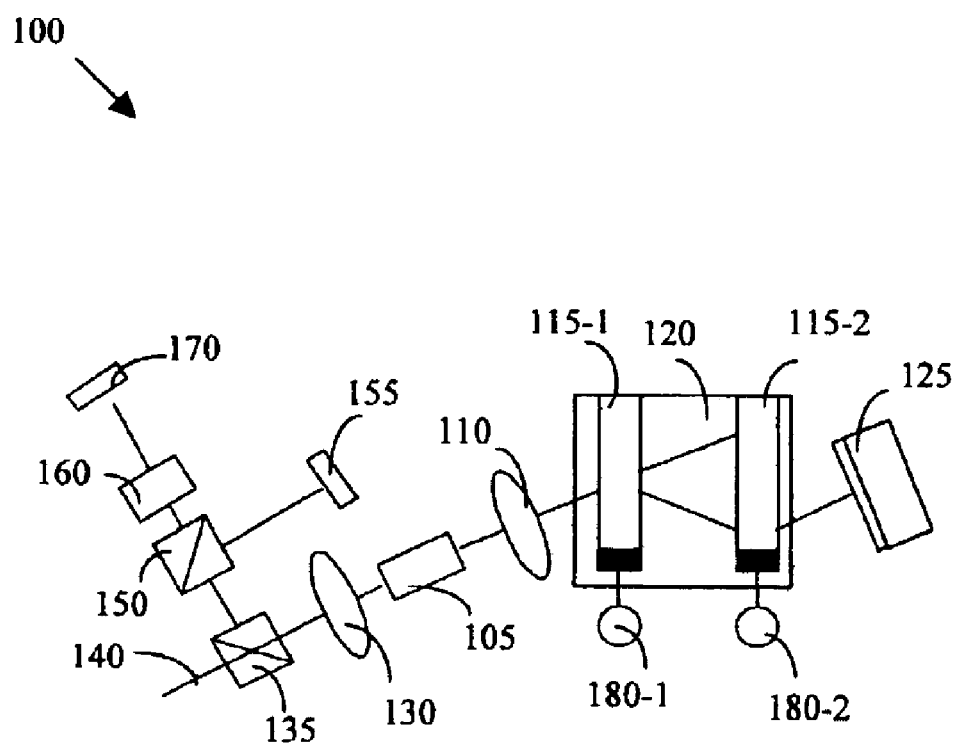
FIG. 1 is a schematic functional block diagram for showing an external-cavity laser (ECL) based acousto-optically tuned laser of this invention.

FIG. 1 shows a functional block diagram for a tunable laser 100 based on External Cavity Laser (ECL) technology. The tunable laser is acousto-optically tuned with wide tuning range. The laser can be continuously tuned or discretely tuned at 25 Ghz and 50 Ghz spacing on the standard ITU grid when integrated with a wavelength locker. The tunable laser as it is configured now can cover easily 100 channels (40 nm) and is provided to move down to 12.5 Ghz spacing in the future. The tunable laser includes a laser diode chip 105 to function as a light source. The laser diode chip 105 is a Fabri-Perot chip laser with broadband, IR emission spectrum. It is the gain cell of ECL laser resonator that is commonly applied in ECL configuration for emitting laser beam to pass through a first collimating lens 110 to project the laser beam onto a main frequency-tuning device 120. The frequency-tuning device 120 is configured as an acousto-optical cell that includes two crystals 115-1 and 115-2. The acousto-optical crystals have a narrow-band optical filtering Bragg grating. After passing through the acousto-optical cell 120, the laser beam is projected to a high reflection mirror 125 driven by a PZT assembly to reflect the beam back to the acousto-optical frequency-tuning cell 120 again to project through the first collimating lens 110 and a second collimating lens 130. The collimated beam is then projected to a first beam splitter 135 that separate a major portion of the beam to an output fiber 140 and a remaining portion of the beam is projected to a second beam splitter 150. From the second beam splitter 150, a first portion of the beam is projected to a first photo-detector 155 and a remaining portion of the beam is projected to a wavelength monitoring locker, e.g., an etalon 160, then monitored by another photo-detector 170. The tunable laser 100 of this invention is configured as an ECL-based tunable laser that has the advantages of high output power, narrow laser oscillation line-width, superior mode quality and high Side Mode Suppression Ratio (SMSR), low RIN noise, and low manufacturing costs.

Two electrodes 180-1 and 180-2 are connected to the acousto-optical crystals 115-1 and 115-2 to control the frequency-tuning function of these two AO crystals. The acousto-optical crystals are provided with diffraction phase gratings for intra-cavity narrow-band wavelength filtering (namely AOTF: acousto-optical-tunable-filter). Specifically, both crystal cells are aligned to the Bragg's angles for high diffraction efficiency in the first order diffraction. As will be further described in more details in a co-pending Patent application, the AOTF of this invention is implemented with a non-collinear AO design in which the acoustic wave propagates almost perpendicular to the light-wave, therefore, this AOTF is enabled to take advantage of the high frequency diffraction effect to achieve narrow filtering bandwidth while using a very small crystal size (<5 mm in length). Furthermore, by using a second crystal as disclosed or a second column as shown in FIG. 3, the frequency shift is corrected with the second crystal or crystal column functioning as a second AOTF. The gratings can also be implemented as Surface Acoustic Wave (SAW) grating and the tunable laser can be implemented as a SAW-based tunable laser. The SAW grating is similar to that of the embodiments as shown above instead the surface acoustic wave (SAW) grating is reflective. The center optical frequency of the acousto-optical gratings is tuned electrically by means of RF signals. The second crystal acts as a second order filter and a wavelength shift compensator. Therefore, the double pass through the second order optical narrowband filter will result in superb optical oscillation line-width. As oppose to other designs of AOTFs that are large and inefficient in terms of power consumption, the AOTF design implemented in the tunable laser and further described, in a separate Patent Application is much smaller in size and consumes as little as <200 mw of RF power. Thus, this enables the integration of the AOTF into a telecomm standard 18 pin-butterfly package (1"x¾"x½") for industrial use. Further studies, as that described in a co-pending Patent Application, indicate the tuning range can be as high as 120 nm covering 300 channels of the 50 Ghz spacing ITU grid. With high-speed electronics, the tuning speed is in the order of microseconds. The improvements of the tuning speed described above are achieved because, unlike the conventional technologies, the turning speed of the AOTF is no longer the limiting factor. Compared to the conventional systems, tuned by MEMS or thermal tuning elements the AOTF of is invention can provide higher tuning speed. Therefore, the tuning speed of the tuning electronics such as the locking speed of the phase lock loop (PLL) of an RF source now becomes the limiting factor of the tuning speed, and for this reason, the tuning speed is significantly improved.

The acousto-optical (AO) crystals 115-1 and 115-2 are acting as volume gratings. When driven by an RF signal, the crystal lattice oscillates in accordance with the frequency of the RF signal resulting periodical variation of optical refractive index of the crystal. The physical length of a period (pitch) defines the grating's diffraction resolution as that of the fixed pitch grating, and is related to the frequency of the RF signal and the acoustic wave traveling speed inside of the crystal, the faster the speed, the longer the grating pitch. On the other hand, the oscillation strength defines the diffraction efficiency and that relates directly to the product of driven signal strength (RF power) and the AO crystal's Figure of Merit. The higher the Figure of Merit, the lower the driven RP power needed for the same level of AO grating diffraction efficiency. In addition to the general properties of regular volume gratings, the AO crystal gratings do provide means for very high efficiency of first-order diffraction. It is because of the nature that, the wave vectors of the traveling acoustic wave, incident optical wave and the diffracted optical wave must satisfy the phase matching condition according to the Braggs law of diffraction. Therefore, with proper design of the crystals, this invention makes use of the highly efficient property of the first-order diffraction as a narrow band optical filter. The details for designing the acousto-optical crystals, as narrow band filters for laser tuning are further disclosed in another co-pending Patent Application filed by a same co-inventor of this Patent Application. The general operational principles are described below for better understanding of this invention.

Because of a traveling wave nature of the AO diffraction grating, the diffracted light is frequency shifted by the amount of the acoustic frequency. The direction of the shift is dependent upon the relative direction of the acoustic wave and the incident light wave and can be understood by the analogy of Doppler Shift. Therefore, in a resonant laser cavity with one crystal and a reflective mirror after it, the reflected light after the forward pass and reverse pass of first order diffraction, as they are being "color" filtered, result in double shift of the light frequency away from the incident light. And this will not result in a highly efficient maintainable laser oscillation. In order to overcome this problem, this invention uses two of such crystals. For practical applications, in order to reduce the production costs, the two crystals are manufactured as one crystal with two cells as one preferred embodiment implemented in one of the products based on the configuration disclosed in this invention. When the first order diffraction from the first crystal enters into the second crystal it is frequency-shifted. Again the shift is a first order diffraction shift but with an opposite frequency shift after the second crystal. This double diffracted light incident onto a reflective mirror results in a zero net frequency shift. The reflected light when transmitted through the two cells the same manner and enters back into the laser gain cell with zero frequency-shift and being filtered four times.

To a specific crystal, the Figure of Merit defines its responsiveness to a driven RF signal. For meaningful Acousto-optical interactions, high Figure of Merit crystals are of interests, these include crystals composed of Lithium Niobate ($LiNbO_3$), Tellurium Dioxide ($TeO_2$), etc. And with RF excitation, two acoustic oscillation modes exist that derives different applications. These modes are longitudinal mode and share mode (transverse mode), and are dependent on the cut orientation relative to crystal principle axes. For Tellurium Dioxide, which is one of the preferred embodiments of this invention, the longitudinal mode is relative easy to excite and with fast acoustic speed. It has low acoustic attenuation but relatively low Figure of Merit, and therefore, requires relatively high RF power. In share mode, its velocity is very slow which results in very high, e.g., easily by 2 orders of magnitudes, Figure of Merit. Therefore, a share mode $TeO_2$ is used as the crystals for configuring the Acousto-optical filter. Other than these materials discussed above, for the purpose of implementing this invention, any birefringent crystals that have high Acousto-optical Figure of Merit may be employed to form the AOTF.

For the purpose of overcoming the difficulties of mode hopping, two moving mechanisms are provided. One is tuned with RF frequency to tune the AO crystals 115-1 and 115-2 and the other with a piezo-electric actuator for driving the reflection mirror 125. In the meantime, for the consideration of tuning speed, the moving range of the piezo-electric actuator needs only to cover the ¼ of free-spectrum range of the cavity mode, which is about 0.4 um. Therefore, with the design, as disclosed in this invention, the tunable laser as now configured can be a high speed tunable laser that is virtually mode hope free.

At each ITU grid (an optical frequency), the AOTF is set to the optical frequency by means of applied RF signals. However, the cavity length and its effective refractive index define the cavity resonant mode, e.g., optical frequency, natural resonant mode. The cavity resonant mode is not necessarily aligned to the center frequency of the AOTF. The filtered laser resonant mode is the result of the competition between the AOTF center frequency and the natural resonant modes of the laser cavity. And when the center frequency of AOTF moves to near the middle of two nearby natural resonant modes during tuning, the resonant mode will become "unstable" as being one of the two competing results of the neighboring modes with the pass band center frequency of the AOTF. Mode hope occurs, which is described as the laser oscillation mode hopes from one mode to the adjacent. The end result is abrupt discontinuity of laser power and wavelength. With the use of PZT, the reflection mirror can be moved. Therefore, when the AOTF is tuned to an ITU grid, the PZT can be adjusted to move the natural resonant cavity mode to the center of the AOTF pass band thus eliminating the instabilities, and ensuring a mode hope free operation at the ITU grid.

Figure 2A:
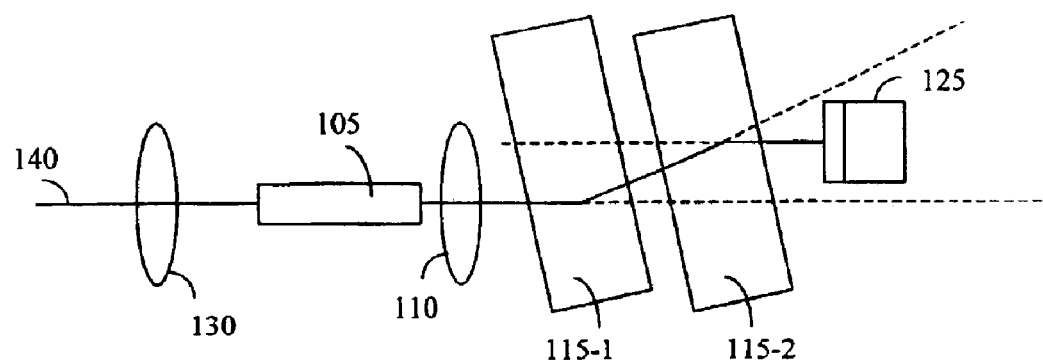
FIGS. 2A to 2D are alternate preferred embodiments similar to FIG. 1 according to the present invention.

FIG. 2A shows a configuration essentially the same as FIG. 1 except that it eliminated two beam splitters 135 and 150 and Etalon for cost cutting purposes. In some applications, there are no requirements for internal monitor of wavelength and laser intensity and cost savings can be achieved by removing the beam splitters, etalon and photo-diodes. First beam splitter take a small portion of main output beam and second beam splitter splits it into two parts: one goes to intensity monitor detector, the other goes through an etalon for wavelength monitor. As a variation of this embodiment, it is also possible to use the beam splitter 135 to reflect a portion of the main output beam to monitor either the intensity or the wavelength of the output beam.

Figure 2B:
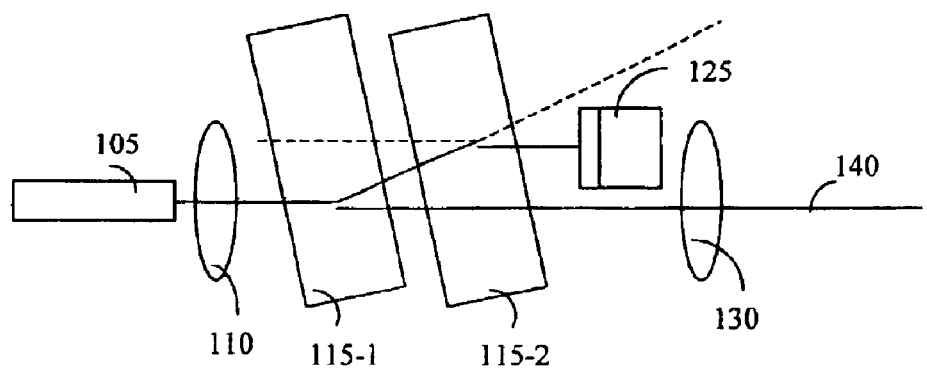

FIG. 2B show another configuration to achieve tunable lasing as that achieved by a tuning laser shown in FIG. 2A with cost savings by removing the beam splitters and detectors from the configuration as shown in FIG. 1. The tuning-laser system shown in FIG. 2B is implemented based on the fact that there are two ways to use the crystal AOTF for tunable laser. The first way is the "front-facet" approach as shown in FIG. 1 and FIG. 2A wherein the front facet of the laser diode has to be coated with partial reflection so that part of the light can be leaked out as lasing light output. The back facet is AR coated (anti-reflection) and there is no resonance within the laser cell itself. The resonance happens between the laser front facet, lens L1, A1 & A2 and the high reflection mirror M. This is why such laser tuning system is named as an external cavity laser, i.e., ECL.

FIG. 2B is implemented with a second approach wherein the front facet of the laser diode is coated with a highly reflective (~100%) coating while the back facet is coated with an AR coating. There is no resonance within the laser cell itself. The resonance happens between the laser front facet, lens 110, 115-1 and 115-2 and the high reflection mirror 125. The laser output can be collected from the Zeroth order grating diffraction (as $1^{st}$ order is used for laser resonance), as indicated as the straight through light passing through lens 130. There is always some zeroth order light in any grating. Even with Bragg's grating, one can only achieve as high as 90% $1^{st}$ order efficiency. So still 10% is in zeroth order. With other gratings, $1^{st}$ order light sometimes is dominant one.

Figure 2C:
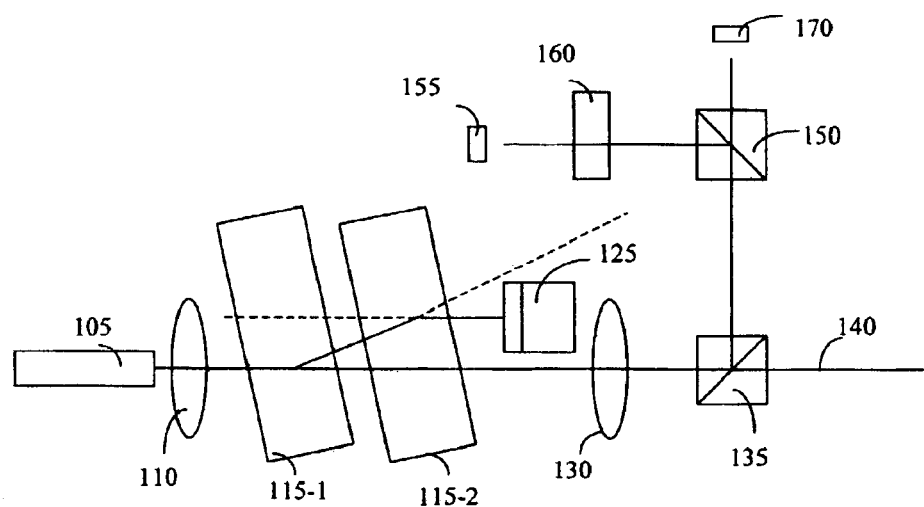
Figure 2D:
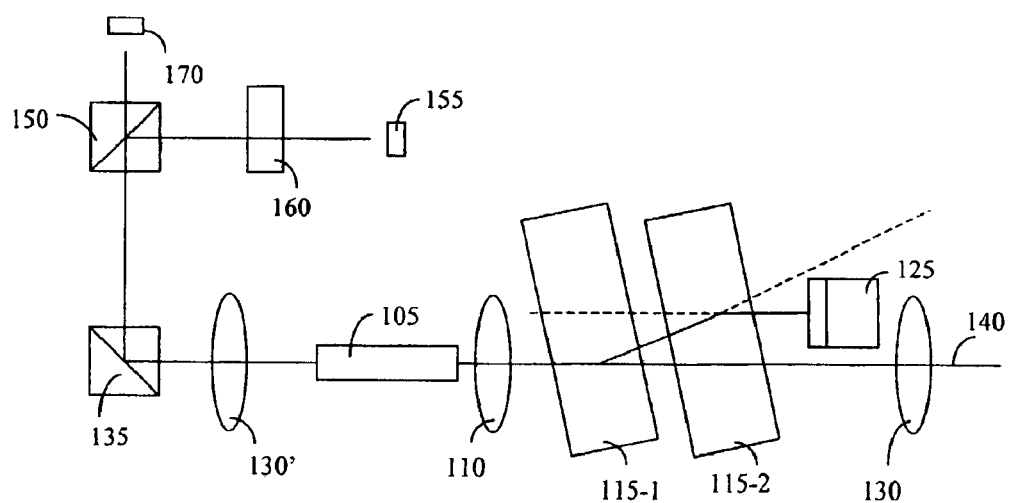

FIG. 2C is another embodiment similar to that shown in FIG. 1 with the monitoring of the laser output intensity and wavelength from the back facet zero-order output beam. FIG. 2D shows another embodiment where the back facet zero-order output beam is implemented as the main laser output. When coating front facet to 100% reflectivity, there is always imperfectness. It may go as high as 99.8%, or one may purposely coat it to 98% with 2% leakage for wavelength and intensity monitor as done with beam splitters, etalon and photo detectors as one alternate arrangement from a configuration shown in FIG. 1.

Figure 3A:
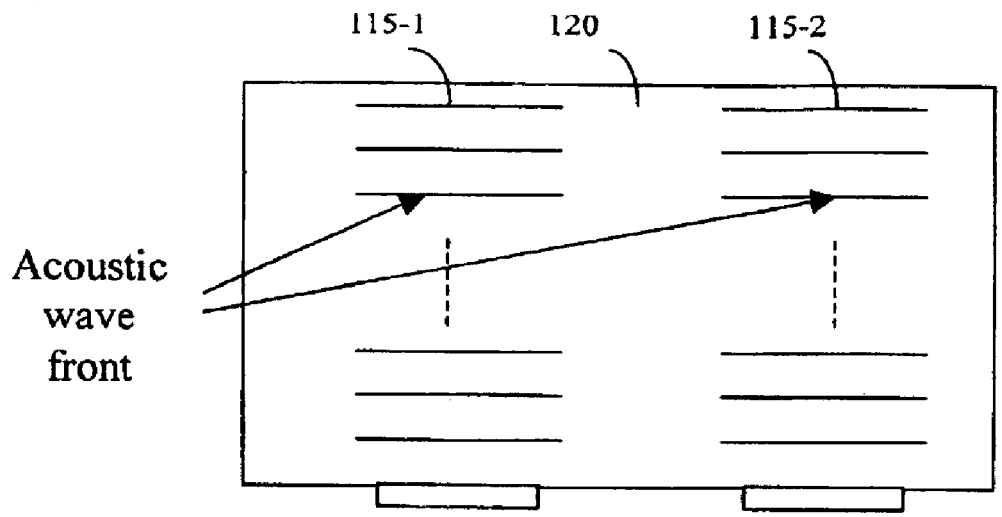
FIGS. 3A and 3B are single Acousto-optical crystal formed with two grating columns along the [110] direction and with an angular alignment with respect to the [110] direction for acoustic propagation.
Figure 3B:
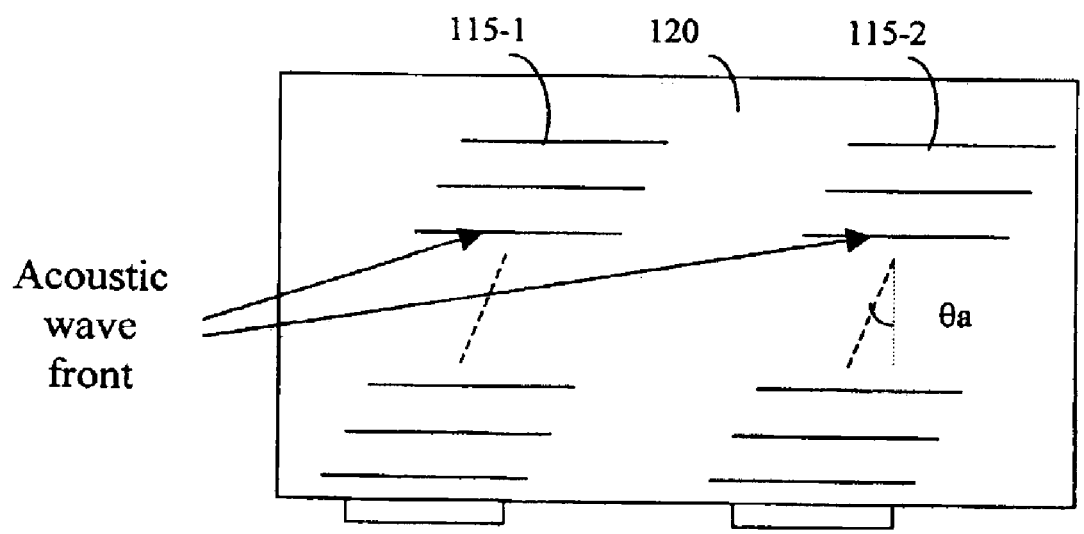

FIG. 3A is a side cross sectional view of the Acousto-optical cell 120 that combines two crystals 115-1 and 115-2 into one crystal with two columns. The electrodes are then connected to the bottom surface. The configuration has the advantages that the manufacturing processes are simplified because one optical assembly process is no longer required and additional effort of optical alignments are eliminated. FIG. 3A shown an alternate embodiment of the acousto-optical cell 120 similar to FIG. 3A but the acoustic wave propagation angle is no longer zero degrees from the [110] direction as that shown above, but was designed and manufactured with a small angle (<10 degrees typically) off the main axis [110]. When crystal is cut, the PZT electrodes platting surface is cut, instead of perpendicular to, but a mall angle (Qa) from the crystals [110] axis. All crystals have three principle axis [100], [010] & [001] as designated in [xyx] axes for optical interactions. For homogeneous crystals, all optical properties are the same along all three axes. For inhomogeneous crystals, optical properties along different principle axis may behave differently as that of birefringent crystals. However, acoustic waves may not necessarily travel along the optical axis. There are two types of acoustic traveling waves: Longitudinal and Share. The Longitudinal wave is a compression wave and the Share wave is simply to the light wave oscillating up/down while traveling horizontally for example. For "on-axis" share wave TeO2, it travels along [110], in Z plane and along the diagonal of X and Y axes. For "Off-axis" share wave, it typically refers to what Variation #2 depicts, a small angle off [110] and Z plane. For angles larger then 10 degrees, it is often referred to as "far off axis designs". The off axis combination as shown may eliminate the need for tilted crystals. It may improve optical degeneracy, which happens often with symmetrical designs as that of the configuration shown in FIG. 3A wherein the-crystal-can be used with either surfaces functioning as the "front" surface.

According to FIGS. 1–3 and above descriptions, this invention discloses an external cavity tunable laser that includes a frequency-tuning device configured as an acousto-optical cell and a reflection means for forward and backward transmitting an optical beam through the acousto-optical cell for generating an optical bean with zero-wavelength shift and at least twice filtered by the acousto-optical cell. In a preferred embodiment, the acousto-optical cell further includes a first and a second acousto-optical crystal. In another preferred embodiment, the acousto-optical cell further comprising a first and a second acousto-optical diffraction means disposed in an acousto-optical crystal. In another preferred embodiment, the acousto-optical cell further comprising a first and a second acousto-optical diffraction columns respectively disposed in an acousto-optical crystal. In another preferred embodiment, the first and second acousto-optical cells are formed as a first column and a second column respectively in a birefringent crystal having a predefined responsiveness to an radio-frequency (RF) driven signal. In another preferred embodiment, the first and a second acousto-optical cells having the narrow-band optical filtering Bragg grating further comprising a surface acoustic wave (SAW) grating.

In summary, this invention further discloses an external cavity tunable laser that includes a frequency-tuning device configured as a non-collinear acousto-optical cell having an acoustic wave propagates almost perpendicular to an optical transmission therethrough.

In essence, this invention further discloses a method for tuning a laser that includes a step of tuning the laser by a frequency-tuning device configured as a non-collinear acousto-optical cell having an acoustic wave propagates almost perpendicular to an optical transmission therethrough. In a preferred embodiment, the method further includes a step of forming the frequency-tuning device as a first and a second acousto-optical diffraction cells.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An external cavity tunable laser comprising:
a frequency-tuning device configured as an acousto-optical cell including a first and a second acousto-optical diffraction means having a narrow-band optical filtering Bragg grating; and
said first and second acousto-optical diffraction means are formed as a first column and a second column respectively in a single acousto-optical crystal.

2. The external cavity tunable laser of claim 1 further comprising:
reflection mirror driven by a PZT assembly to reflect a beam projected from said acousto-optical cell back to transmit therethrough again.

3. The external cavity tunable laser of claim 2 wherein:
said first electrode is connected to an RF signal for tuning a central frequency of said narrow band Bragg grating.

4. The external cavity tunable laser of claim 2 wherein:
said second electrode is connected to a second electric source to provide a second order filtering for compensating a wavelength shift.

5. The external cavity tunable laser of claim 1 further comprising:
a first electrode connected to said first acousto-optical diffraction means and a second electrode connected to said second acousto-optical diffraction means.

6. The external cavity tunable laser of claim 1 wherein:
said first and second acousto-optical diffraction means having diffraction phase gratings for intra-cavity narrow-band wavelength filtering.

7. The external cavity tunable laser of claim 1 further comprising:
a collimated laser source for projecting a collimated optical signal of specific wavelength through said acousto-optical cell.

8. The external cavity tunable laser of claim 1 wherein:
said first column and said second column are formed in a Lithium Niobate (LiNbO$_3$) crystal.

9. The external cavity tunable laser of claim 1 wherein:
said first column and said second column are formed in a Tellurium Dioxide (TeO$_2$) crystal.

10. The external cavity tunable laser of claim 1 wherein:
said first column and said second column are formed in a birefringent crystal having a predefined responsiveness to an radio-frequency (RF) driven signal.

11. The external cavity tunable laser of claim 1 wherein:
said first and a second acousto-optical diffraction means having said narrow-band optical filtering Bragg grating further comprising a surface acoustic wave (SAW) grating.

12. An external cavity tunable laser comprising:
a frequency-timing device configured as an acousto-optical cell and a reflection means for forward and backward transmitting an optical beam through said acousto-optical cell for generating an optical beam with zero-wavelength shift and at least twice filtered by said acousto-optical cell; and
said acousto-optical cell further comprising a first and a second acousto-optical diffraction columns respectively disposed in an acousto-optical crystal.

13. The external cavity tunable laser of claim 12 wherein:
said first and second acousto-optical diffraction columns are formed in a birefringent crystal having a predefined responsiveness to an radio-frequency (RF) driven signal.

14. The external cavity tunable laser of claim 12 wherein:
said first and a second acousto-optical diffraction columns further comprising narrow-band optical filtering Bragg gratings.

* * * * *